(12) United States Patent
Bacchin et al.

(10) Patent No.: US 11,699,997 B2
(45) Date of Patent: Jul. 11, 2023

(54) ELECTRICAL SWITCH WITH COMBINED COMMANDS

(71) Applicant: Iotty Srl, Porcia (IT)

(72) Inventors: Alberto Bacchin, Porcia (IT); Edoardo Cesari, Porcia (IT)

(\*) Notice: Subject to any disclaimer, the term of this patent is extended or adjusted under 35 U.S.C. 154(b) by 81 days.

(21) Appl. No.: 17/367,570

(22) Filed: Jul. 5, 2021

(65) Prior Publication Data

US 2022/0286130 A1 Sep. 8, 2022

(30) Foreign Application Priority Data

Mar. 4, 2021 (IT) .................. 102021000005105

(51) Int. Cl.
*H03K 17/96* (2006.01)

(52) U.S. Cl.
CPC .............. *H03K 17/9622* (2013.01); *H03K 2217/960735* (2013.01)

(58) Field of Classification Search
CPC .............. G07C 9/0069; G07C 9/00126; B60R 2300/40; B60R 25/00; B60R 25/01; B60R 25/10; B60R 25/23; H01H 2003/02; H01H 2003/0293; H01H 2239/074; H03K 2217/00; H03K 2217/94; H03K 2217/9401; H03K 2217/94021; H03K 2217/94031; H03K 2217/94036; H03K 2217/94047; H03K 2217/94052; H03K 2217/94084; H03K 2217/94094; H03K 2217/945; H03K 2217/96; H03K 2217/9607; H03K 2217/960735; H03K 17/00; H03K 17/002; H03K 17/005; H03K 17/68; H03K 17/725; H03K 17/735; H03K 17/94; H03K 17/945; H03K 17/96; H03K 17/962; H03K 17/9622
USPC ........................................................ 200/600
See application file for complete search history.

(56) References Cited

U.S. PATENT DOCUMENTS

| 10,239,489 B2 * | 3/2019 | Liubakka ................ B60R 25/23 |
| 2015/0360647 A1 * | 12/2015 | Mathews .............. G06F 3/0445 345/174 |

\* cited by examiner

*Primary Examiner* — Anthony R Jimenez
(74) *Attorney, Agent, or Firm* — Themis Law

(57) ABSTRACT

A device for closing or opening two or more main switches of corresponding electrical power supply circuits of related electrical devices includes a plate having at least two capacitive touch contact areas, and a control circuit configured to control two or more additional switches so that, in the event that only one of the contact areas is touched, only the corresponding main switch is opened or closed, while in the event of a combined touching of at least two of the contact areas, one of the additional switches is opened or closed.

6 Claims, 2 Drawing Sheets

ELECTRICAL SWITCH WITH COMBINED COMMANDS

FIELD OF THE INVENTION

The present invention relates to switch devices, present in all types of buildings, for both civil and industrial use, for the switching on/off of indoor or outdoor lights, electrical sockets, thermostats, the opening/closing of doors, gates, curtains and shutters or for other electrical equipment for civil or industrial use.

BACKGROUND OF THE INVENTION

The prior art includes various types of electro-mechanical switch devices, and more recently they are also equipped with various types of sensors, such as a touch screen, which enables the switching on and off of lights or electrical equipment in general, as well as the opening and closing of doors, gates, curtains, shutters and other devices in general.

Said switch devices equipped with suitable sensors may have a single switch on a plate or can be placed in groups of two or three or more on a single plate and may include backlighting systems in order to help the user to identify the switch to be used.

Said switch devices are commonly installed on a plate supporting the power and switching modules and serving as a coupling element for the front plate.

Each plate will support a certain number of switches, for example three, where each of said switches will be able to open and close a circuit relating to a specific lighting body or to specific electrical equipment.

Capacitive touch-controlled on/off devices are known in the prior art and comprise a plate on which there are areas sensitive to the contact of human fingers or other conductive bodies that activate the switches in such a way that the simple contact of those areas causes the opening/closing of the circuits connected to them.

SUMMARY OF THE INVENTION

The present invention relates to a new improved switch device with combined control.

The purpose of the present invention is to increase the number of functions of each capacitive touch plate, so that, using for example a plate with three switches, that is, with three contact areas, at least five electrical devices connected to the plate itself can be activated/deactivated.

The same applicant is the proprietor of Italian patent 102018000007749, which we cite in its entirety, concerning a device for closing/opening two or more switches of corresponding power supply circuits of related electrical equipment, comprising:

at least one plate having at least two capacitive touch contact areas, where the individual touch of each of said contact areas involves the opening/closing of a corresponding main switch, a control circuit;

and wherein said control circuit is configured so that, if at least two of said contact areas are touched simultaneously or within a determined time interval, said main switches are not activated, but an additional switch is opened/closed.

In fact, this device provides for the simultaneous multiple reading of the switches, so that, in the event of the substantially simultaneous activation of more than one switch, by touching them, an additional electrical device is switched on or off.

In other words, when two or more switches are activated by means of a substantially simultaneous touch or in any case within a specified time interval, the individual switches are not activated, but an additional function is activated which will open/close an additional circuit.

The identification of the type of touch, whether individual or combined, takes place through the following algorithm:

(1) When a first area is touched, a timer is launched, set to a specific time interval, for example in the order of 100 msec.

(2) If, during said specific time interval, a control circuit does not detect any other touch, then, at the end of said specific time interval, the switch corresponding to said first contact zone is activated;

(3) If, on the other hand, during said specific time interval, said control circuit detects one or more further touches of further contact areas, an additional function is activated.

If the plate comprises three or more contact areas, different touch combinations of said areas may activate various corresponding additional functions.

For example, if on said plate there are three zones aligned from left to right, touching the first two zones on the left activates a first additional function, while touching of the first two zones on the right activates a second additional function.

To further increase the number of functions that can be activated by a single device of the type described above, a new improved switch device with combined controls was developed and constructed, which is particularly useful in modern homes where ever more electrical devices are used that require corresponding switches and it is not always possible to use large plates.

With the new device it will be possible, for example, with a plate equipped with only two contact areas, to activate at least four different functions, instead of three as noted in the previously mentioned patent.

By way of example, assuming a plate with two contact areas, each connected to a main switch for the activation/deactivation of a device, it is possible to enable the following functions:

touching the first contact zone to activate only the first main switch;

touching the second contact zone to activate only the second main switch;

simple combined touching of said first and second contact areas to activate a single third additional switch, wherein combined contact means the condition in which the two contact areas are touched simultaneously or in any case within a given first time interval with a specific limit threshold, and where the touch lasts for a time shorter than a second time interval;

prolonged combined touching of said first and second contact areas to activate a single fourth additional switch, wherein combined and prolonged touching means the condition in which the two contact areas are touched simultaneously or in any case within a given first time interval, and wherein the touch is prolonged for at least a third time interval.

By way of example, if the touching of the two contact areas extends for 1 second, it is a simple combined contact and the third switch is activated, while if the touching of the two contact areas extends for 3 seconds, it is a prolonged combined contact and the fourth switch is activated.

Basically, in the new switch device, said control circuit is electrically connected to at least two main switches and to at least two secondary switches, and is configured in such a way that the combined touching of at least two contact zones causes the activation of at least one additional switch, and not of said main switches, and where the duration of the combined touching determines which of said additional switches will be activated.

DETAILED DESCRIPTION OF EMBODIMENTS OF THE INVENTION

Figure 1:
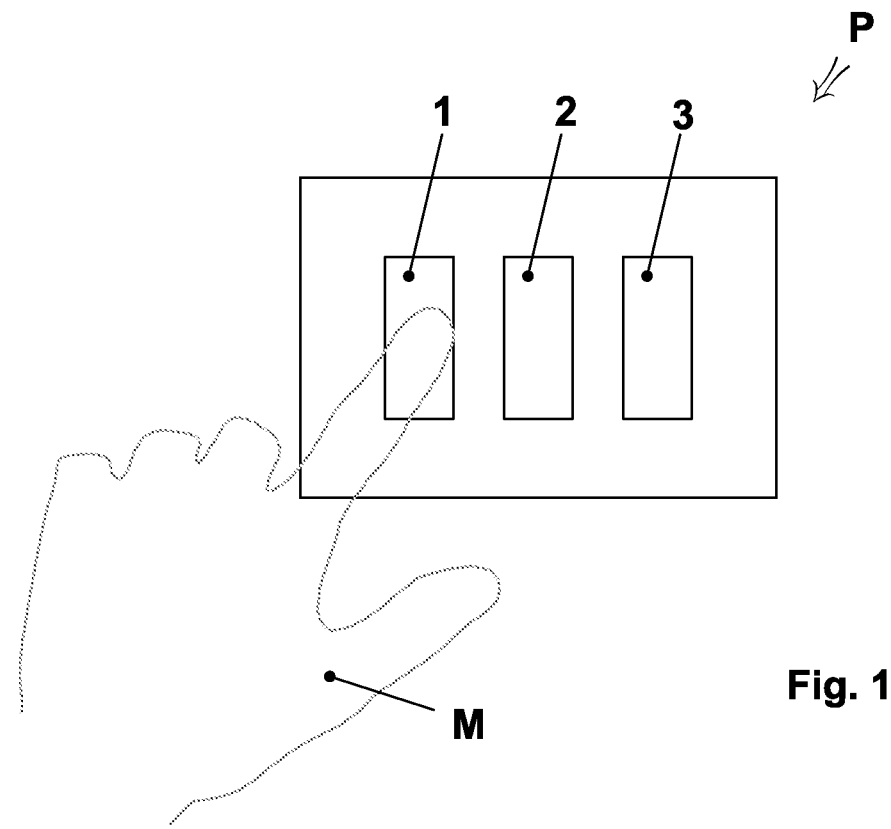
FIG. 1 shows a front view of a plate equipped with three contact areas, each corresponding to a main switch of an electrical circuit for supplying an electrical device.

FIG. 1 shows a front view of the plate (P) equipped with three contact areas (1, 2, 3), each corresponding to a relative main switch of an electrical circuit for supplying an electrical device.

Each of these main switches is capable of opening/closing the circuit connected to them for the activation/deactivation of a corresponding electrical device.

Figure 2:
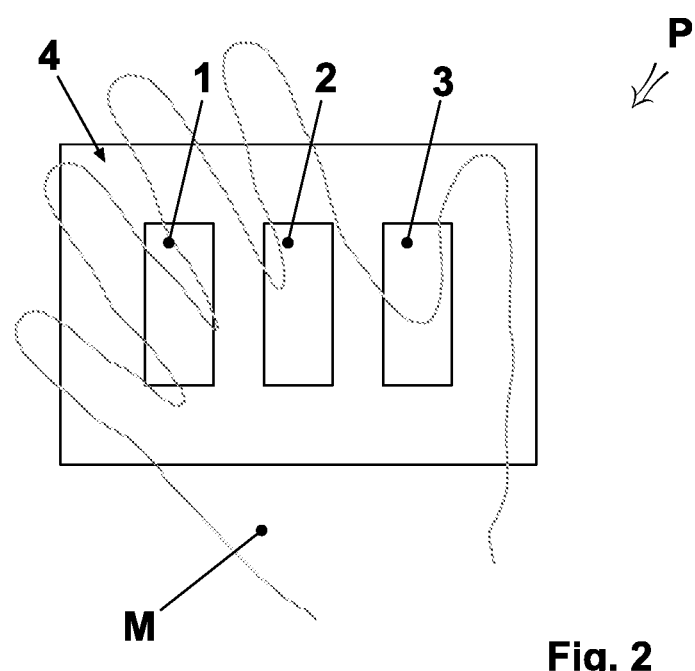
FIG. 2 shows an example of use of an electrical switch according to the invention, in which a fourth switch is actuated that corresponds to the power supply circuit of another electric device.

FIG. 2 shows a practical application of the new invention, wherein placing the entire hand (M) near said plate (P) activates the fourth additional switch, in turn connected to a corresponding electric power supply circuit of an additional electrical device.

In fact, by placing a hand (M) on said contact areas (1, 2, 3), two or more of the relative switches will be activated substantially simultaneously or in any case within a specified time interval.

In this case the corresponding circuits will not be opened/closed, but rather the device of the invention will interpret the simultaneous touching of the contact zones (1, 2, 3) as a combination and therefore, an additional circuit will be opened/closed.

In the case illustrated in FIG. 2, therefore, the combined contact with the contact areas (1, 2, 3) will not activate any of the three main switches connected to them, rather it will activate an additional switch of an additional electrical circuit that powers a different electrical device.

Alternatively, the surface of the plate (P) outside said contact areas (1, 2, 3) may itself be a fourth contact area (4) for a fourth switch and where the combined touching of the hand on two or more points of said fourth contact zone (4) activate a relative switch of a fourth circuit.

Figure 3A:
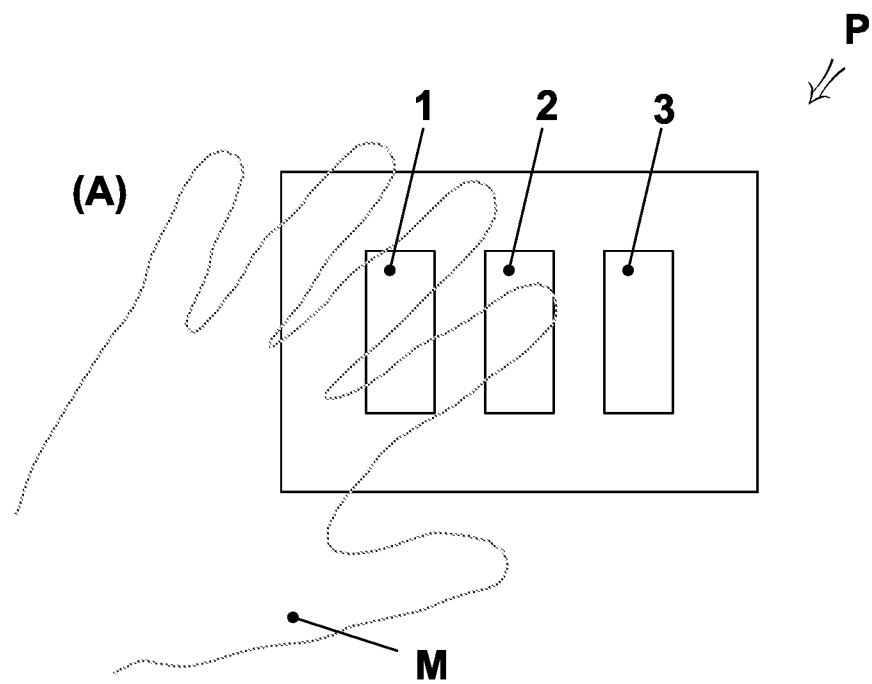
FIGS. 3a and 3b show that additional functions may be activated by touching different combinations of the contact areas.
Figure 3B:
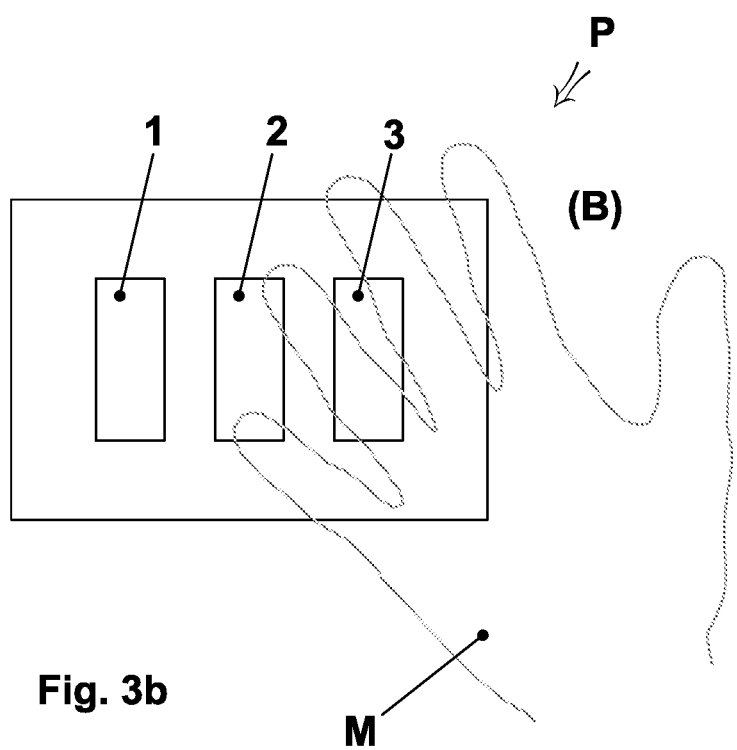

FIGS. 3a and 3b show how by touching different combinations of said contact areas (1, 2, 3) various corresponding additional functions may be activated.

For example, touching the left contact zones (1, 2) (FIG. 3a) activates an additional function (A), while touching the right contact zones (2, 3) (FIG. 3b) activates a different additional function (B).

In this case it will also be possible to combine further additional functions according to the varied duration of the contact.

The main innovation of the present invention is the fact that the electronic control circuit of the new device is configured in such a way as to also be connected to two or more additional switches, and where the duration of said combined contact determines the selection of one of said additional switches.

Said control circuit may also be configured so that the duration of the contact with only one of said contact areas determines the selective opening/closing of said main switch or of a further supplementary switch. For example, touching a certain zone for a duration within a certain time interval, opens/closes the main switch corresponding to that contact zone, while touching for a duration greater than said time interval, opens/closes an additional switch, different than said main switch.

These are the schematic outlines which are sufficient for the expert in the art to carry out the invention, and as a result, in the practical application variants may be provided which do not affect the substance of the innovative concept disclosed herein.

Therefore, with reference to the preceding description and the attached drawings the following claims are expressed.

The invention claimed is:

1. A device for opening or closing a plurality of main switches of electrical power supply circuits, comprising:
   a plate having a plurality of touch contact areas of capacitive type, wherein an individual touching of each of said plurality of touch contact areas causes the opening or closing of a corresponding main switch; and
   a control circuit;
   wherein said control circuit is configured to control a plurality of additional switches, so as to cause:
   when only one of said plurality of touch contact areas is touched, only the corresponding main switch is opened or closed, and
   when a combined touching of at least some of said plurality of touch contact areas occurs, one of said plurality of additional switches is opened or closed but not one of the plurality of said main switches,
   wherein the combined touching identifies a condition in which at least two of said plurality of touch contact areas are touched simultaneously or within a first predetermined time interval, and
   wherein maintaining said combined touching for a different amount of time causes a selective opening or closing of another one of said plurality of additional switches.

2. The device according to claim 1, wherein the plurality of contact areas are at least three touch contact areas, wherein said control circuit is configured so that, when two or more of said at least three contact areas are touched simultaneously or within said first predetermined time interval with a predetermined combination, a predetermined one of the plurality of additional switches is opened or closed and not said main switches.

3. The device according to claim 1, further comprising at least one timer set with regard to said first predetermined time interval and configured to start when a first touch of one of said plurality of touch contact areas occurs, wherein said control circuit is configured so that, when at least two of said plurality of touch contact areas are touched within said first predetermined time interval, and when a combined contact condition is true, at least one of said plurality of additional switches and not said main switches are opened/closed.

4. The device according to claim 3, further comprising at least one timer set with regard to a second predetermined time interval and configured to start when said combined contact condition is true, wherein said control circuit is configured so that:

when said combined touching has a duration within said second predetermined time interval, when a combined contact condition is true, a first one of said plurality of additional switches is opened or closed; and when said combined touching has a duration greater than said second predetermined time interval, when an extended combined contact condition is true, a second of said plurality of additional switches is opened or closed.

5. The device according to claim 1, wherein said control circuit is further configured so that a duration of the touching of only one of said plurality of contact areas causes a selective opening or closing of said corresponding main switch or of said plurality of additional switches.

6. The device according to claim 5, wherein said control circuit is configured so that:

in case of a combined touching of two of the plurality of touch contact areas to a left of the plate, one of said plurality of additional switches is selectively activated, and in case of the combined touching of the two of the plurality of touch contact areas to a right of the plate, another one of said plurality of additional switches is selectively activated.

* * * * *